(12) United States Patent
Chen et al.

(10) Patent No.: US 11,398,378 B2
(45) Date of Patent: Jul. 26, 2022

(54) METAL ON METAL MULTIPLE PATTERNING

(71) Applicant: GLOBALFOUNDRIES INC., Grand Cayman (KY)

(72) Inventors: Hsueh-Chung Chen, Cohoes, NY (US); Ravi P. Srivastava, Clifton Park, NY (US); Somnath Ghosh, Clifton Park, NY (US); Nicholas V. Licausi, Watervliet, NY (US); Terry A. Spooner, Mechanicville, NY (US); Sean Reidy, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 155 days.

(21) Appl. No.: 17/023,853

(22) Filed: Sep. 17, 2020

(65) Prior Publication Data
US 2021/0005454 A1 Jan. 7, 2021

Related U.S. Application Data

(62) Division of application No. 16/125,066, filed on Sep. 7, 2018, now Pat. No. 10,818,494.

(51) Int. Cl.
*H01L 21/033* (2006.01)
(52) U.S. Cl.
CPC ...... *H01L 21/0332* (2013.01); *H01L 21/0337* (2013.01); *Y10T 428/24917* (2015.01)

(58) Field of Classification Search
None
See application file for complete search history.

(56) References Cited

U.S. PATENT DOCUMENTS

| | | | |
|---|---|---|---|
| 8,741,763 B2 | 6/2014 | Ma et al. | |
| 8,921,225 B2 | 12/2014 | Yuan et al. | |
| 9,269,627 B1 | 2/2016 | Cheng et al. | |
| 10,490,447 B1 | 11/2019 | Cheng et al. | |
| 2015/0140812 A1 | 5/2015 | Zope et al. | |
| 2016/0093502 A1 | 3/2016 | Cheng et al. | |
| 2016/0126130 A1 | 5/2016 | Takahashi et al. | |
| 2016/0314985 A1 | 10/2016 | Yang et al. | |

FOREIGN PATENT DOCUMENTS

WO 2017171751 10/2017

OTHER PUBLICATIONS

James Hsueh-Chung Chen et al. "Segment Removal Strategy in SAQP Technology for Advanced BEOL Application", Proc. of IITC, Hsinchu, Taiwan, May 16-18, 2017, 3 pages.

*Primary Examiner* — Roberts P Culbert
(74) *Attorney, Agent, or Firm* — Anthony Canale; Andrew M. Calderon; Roberts Calderon Safran & Cole, P.C.

(57) ABSTRACT

The present disclosure relates to a structure which includes a first metal layer patterned as a mandrel, a dielectric spacer on the first metal layer, and a second metal layer on the dielectric spacer.

20 Claims, 20 Drawing Sheets

METAL ON METAL MULTIPLE PATTERNING

FIELD OF THE INVENTION

The present disclosure relates to semiconductor structures, and more particularly, to a metal on metal integration schemes and respective fabrication processes.

BACKGROUND

Multiple patterning has been practiced in recent technology nodes fir advanced CMOS manufacturing before the matureness of extreme ultraviolet (EUV) lithography. Among all the practical schemes, self-aligned double patterning (SADP) is a front-up integration scheme which has simplified the overlay control and provided an improved RC performance. However, the complexity of process steps and tight process margins are challenges for the adoption of SADP in a high-volume manufacturing (HVM) facility.

SUMMARY

In an aspect of the disclosure, a structure comprises: a first metal layer patterned as a mandrel; a dielectric spacer on the first metal layer; and a second metal layer on the dielectric spacer.

In another aspect of the disclosure, a structure comprises: a metal mandrel with cuts along its longitudinal extent, a metal layer on the metal mandrel, a plurality of low-k dielectric spacers on sidewalls of the metal mandrel, and a metal cap on the metal layer.

In another aspect of the disclosure, a method comprises: patterning a first metal layer as a mandrel; forming a dielectric spacer on the first metal layer; forming a second metal layer on the dielectric spacer; and forming a metal cap on the second metal layer.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1A:
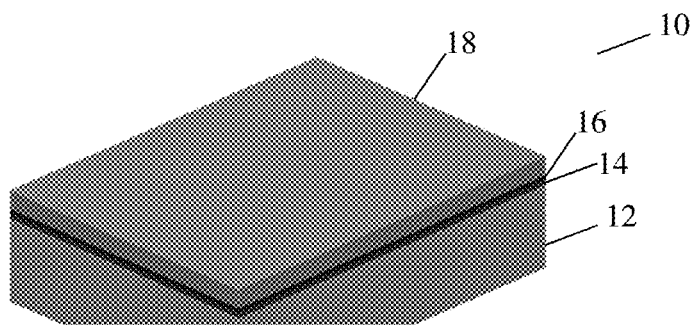
FIGS. 1A-1K show a metal on metal integration scheme with a low-k spacer and respective fabrication processes in accordance with aspects of the present disclosure.

The present disclosure relates to semiconductor structures, and more particularly, to a metal on metal integration schemes and respective fabrication processes. The metal on metal integration schemes reduce process steps and the dependency on etching steps compared to conventional integration schemes. More specifically, the present disclosure can reduce the process steps over a three-cut conventional integration scheme by approximately 40% and over a two-cut conventional integration scheme by approximately 25%. Further, the present disclosure reduces the dependency on etching steps by approximately 55% over a three-cut conventional integration scheme and approximately 35% over a two-cut conventional integration scheme.

In embodiments, the metal on metal multiple integration schemes of the present disclosure include patterning a first metal as the mandrel. A dielectric spacer is deposited onto the metal mandrel and etched back. A second metal is deposited onto the dielectric spacer, followed by a chemical mechanical planarization (CMP). A cap can be placed on the metal layer. As a result of the metal on metal integration scheme, a simple and high yield process can be achieved which reduces the process steps and the dependency on etching steps in comparison to conventional fabrication schemes.

The semiconductor structures of the present disclosure can be manufactured in a number of ways using a number of different tools. In general, though, the methodologies and tools are used to form structures with dimensions in the micrometer and nanometer scale. The methodologies, i.e., technologies, employed to manufacture the semiconductor structures of the present disclosure have been adopted from integrated circuit (IC) technology. For example, the structures are built on wafers and are realized in films of material patterned by photolithographic processes on the top of a wafer. In particular, the fabrication of the semiconductor structures use three basic building blocks: (i) deposition of thin films of material on a substrate, (ii) applying a patterned mask on top of the films by photolithographic imaging, and (iii) etching the film selectively to the mask.

FIGS. 1A-1K show a metal on metal integration scheme with a low-k spacer and respective fabrication processes in accordance with aspects of the present disclosure. More specifically, in FIG. 1A, structure 10 includes a wafer 12 composed of semiconductor material. In embodiments, the semiconductor material can be, but not limited to, Si, SiGe, SiGeC, SiC, GaAs, InAs, InP, and any other III/V or II/VI compound semiconductors. A plasma enhanced tetraethyl orthosilicate (PETEOS) material 14 is formed on the wafer 12, followed by a nitrogen doped carbide (NDC) material 16 on the PETEOS material 14. A film stack 18 is deposited on the NDC material 16. In a specific embodiment, the film stack 18 can be a cobalt film. In alternative embodiments, the film stack 18 can be one of cobalt, ruthenium, nickel, aluminum, tungsten, and tantalum.

Figure 1B:
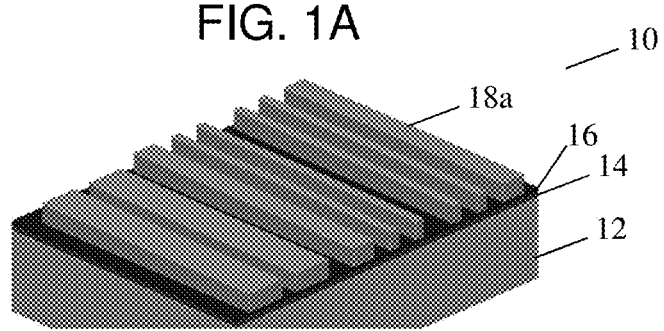

In FIG. 1B, a metal mandrel 18a is patterned from the film stack 18, e.g., with a critical dimension (CD), e.g., 40 nm. In order to pattern the metal mandrel 18a, a spin on hardmask (SOH) coating is formed on top of the film stack 18. A silicon oxynitride (SiON) deposition is formed on the SOH coating. A bottom anti-reflective coating (BARC) is deposited on the SiON and a resist coating is deposited on the BARC. The resist is subjected to energy (light) to form openings. The BARC is then patterned by an etching process with a selective chemistry, e.g., reactive ion etching (RIE), which forms one or more trenches in the BARC through and aligned with the openings of the resist. The resist can then be removed by a conventional oxygen ashing process or other known stripants. The film stack 18 (e.g., cobalt) is then etched through the BARC pattern which produces the mandrel patterned structure 18a in FIG. 1B. The BARC and SOH can be stripped after the patterning.

Figure 1C:
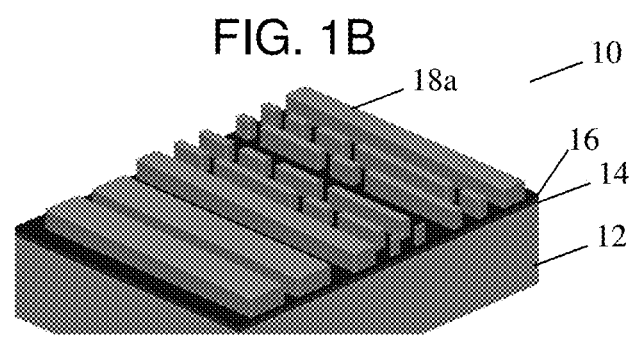

In FIG. 1C, the mandrel 18a is cut along its vertical (i.e., longitudinal) extent. In order to cut the mandrel 18a, a SOH coating is formed on the mandrel 18a. Then, SiON is deposited on the SOH coating. A BARC is deposited on the SiON and a resist coating is deposited on the BARC. As previously discussed, the BARC is patterned through the openings of the resist. The SiON is then patterned, and cuts are formed in the cobalt (i.e., the mandrel 18a). The SOH coating is stripped, which leaves the mandrel 18a with cuts as shown in FIG. 1C.

Figure 1D:
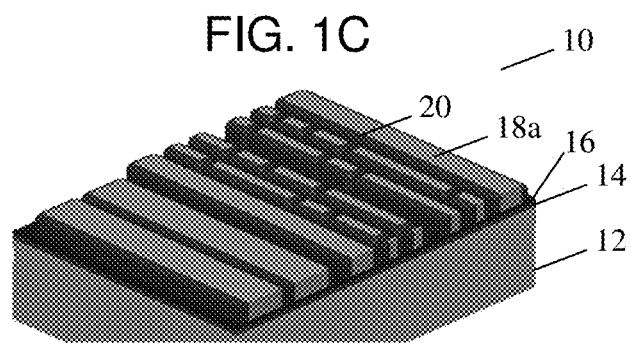

In FIG. 1D, a spin on dielectric low-k (SOD-LK) spacer 20 is deposited on sidewalls of the mandrel 18a. The SOD-LK spacer 20 can have a k value less than 2.75. In embodiments, the SOD-LK spacer material 20 is deposited by a conventional chemical vapor deposition process, followed by an anisotropic etch to remove the SOD-LK spacer 20 from horizontal surfaces, leaving the material on sidewalls of the patterned film structures.

Figure 1E:
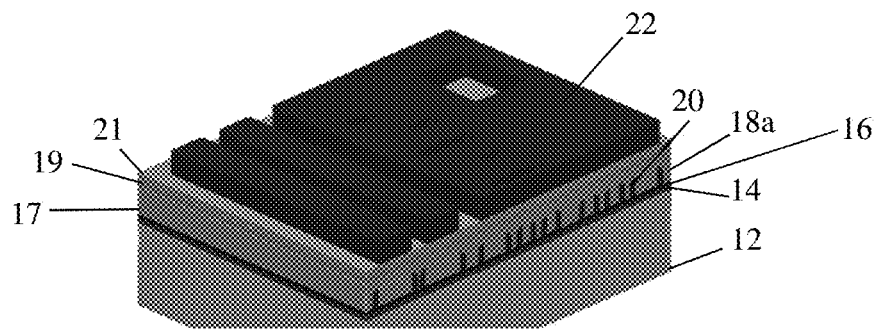

In FIG. 1E, a non-mandrel cut litho patterned material 22 is deposited and patterned on the SOD-LK spacer 20. In this process, a SOH coating 17 is formed on the SOD-LK spacer 20 followed by SiON 19 deposited on the SOH coating 17. A BARC 21 is deposited on the SiON 19 and a resist coating 22 is deposited on the BARC 19. The resist coating 22 is exposed to energy to form the non-mandrel cut litho patterned material 22 on the BARC 24 with a critical dimension (CD), e.g., 50 nm.

Figure 1F:
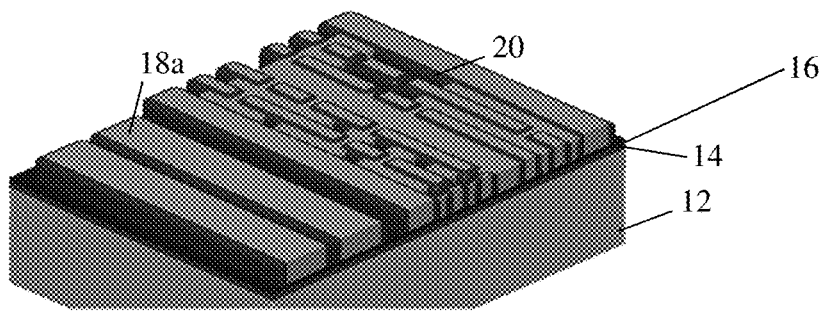

In FIG. 1F, a SOH coating is etched back by first etching back the BARC and SiON with a selective chemistry, e.g., RIE. The SOH coating can then be etched back, leaving the SOD-LK spacer 20 in selective locations, aligned with the pattern of the non-mandrel cut litho patterned material 22.

Figure 1G:
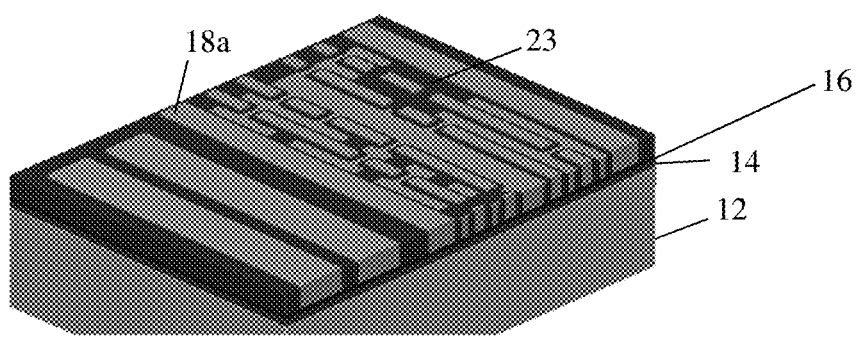

In FIG. 1G, a spin on dielectric low-k (SOD-LK) material 23 is formed between the SOD-LK spacers 20. The SOD-LK material 23 is deposited by a conventional deposition material, followed by an etch back to slightly recess the SOD-LK material 23 below the metal cut structure 18a.

Figure 1H:
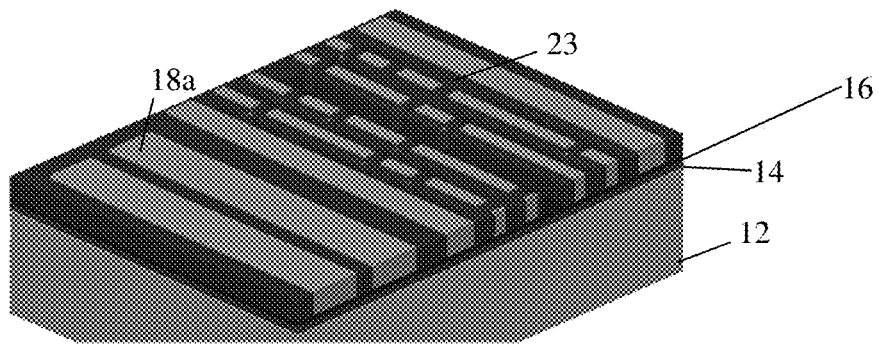
Figure 1I:
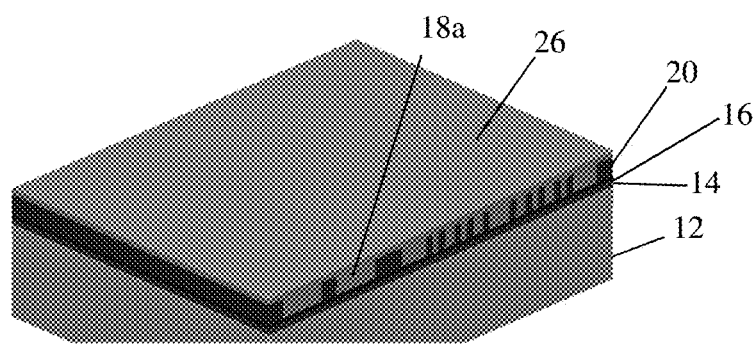
Figure 1J:
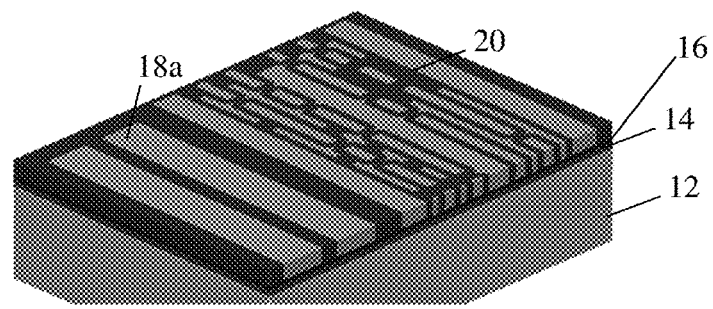
Figure 1K:
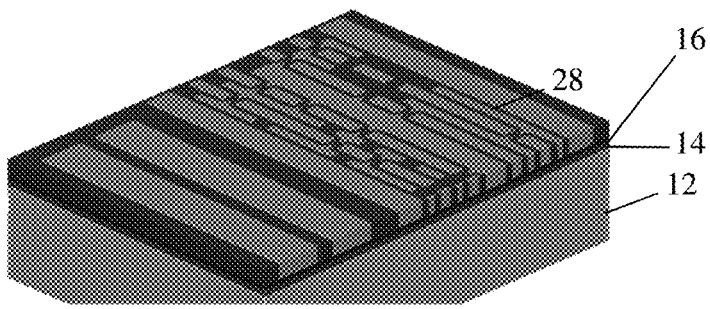

In FIG. 1H, the SOH is selectively stripped without the use of a mask. In FIG. 1I, a film stack 26 is deposited on the mandrel 18a. In a specific embodiment, the film stack 26 can be a same material as the film stack 18. For example, the film stack 26 can be cobalt. In alternative embodiments, the film stack 26 can be one of copper, cobalt, ruthenium, nickel, aluminum, tungsten, and tantalum. In FIG. 1J, the film stack 26 is planarized, for example, by a CMP process. In FIG. 1K, a metal cap 28 is deposited to create a final metal pattern with the cobalt (e.g., film stack 18) in the SOD-LK spacer 20. In a specific embodiment, the metal cap 28 can be tantalum (i.e., Ta) growth on the film stack 18. In alternative embodiments, the metal cap 28 can be cobalt.

Figure 2A:
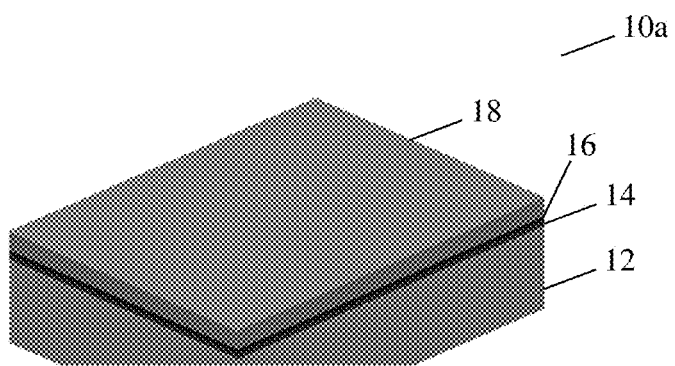
FIGS. 2A-2K show a metal on metal integration scheme with a low-k spacer and a second metal and respective fabrication processes in accordance with aspects of the present disclosure.
Figure 2B:
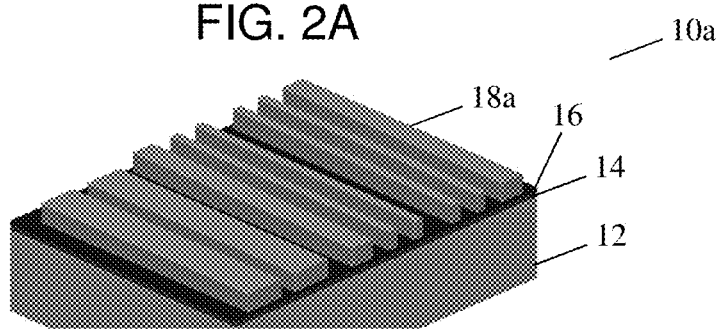
Figure 2C:
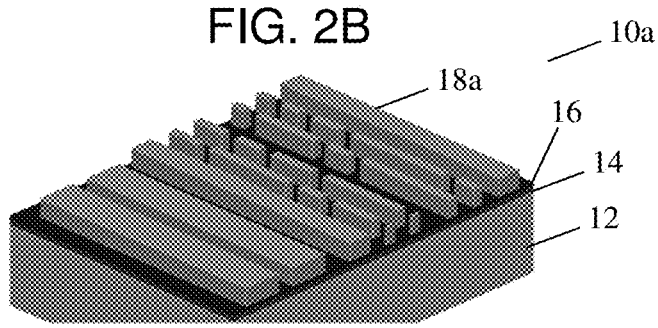
Figure 2D:
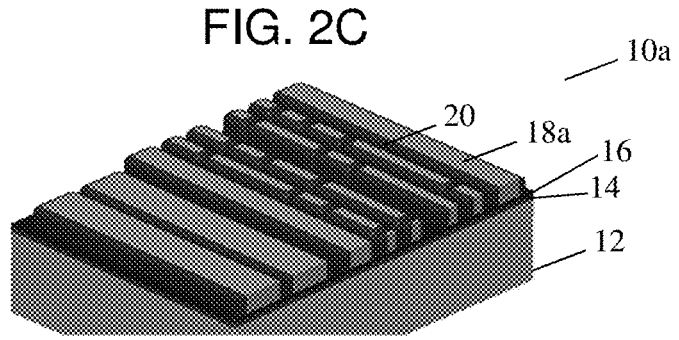
Figure 2E:
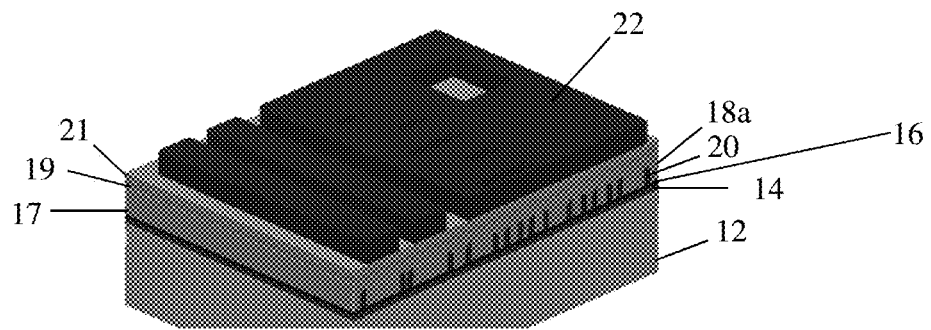
Figure 2F:
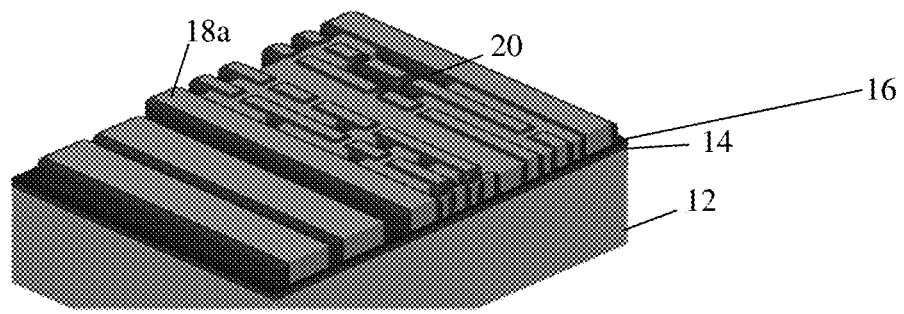
Figure 2G:
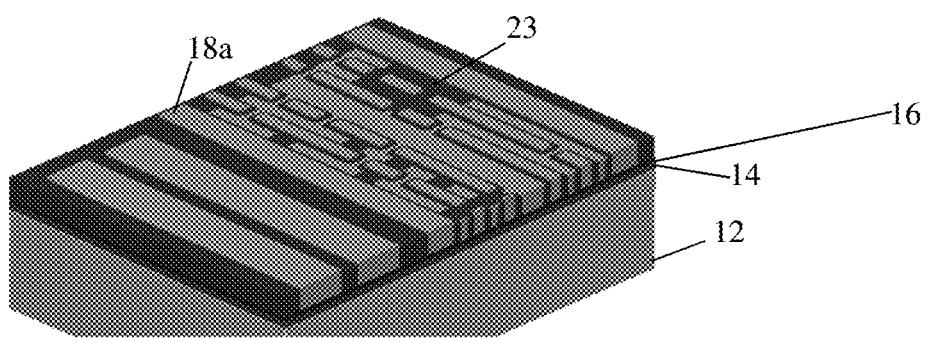
Figure 2H:
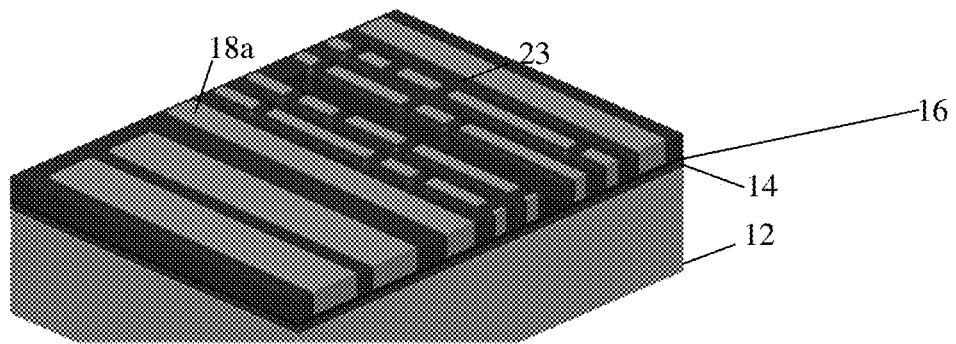
Figure 2I:
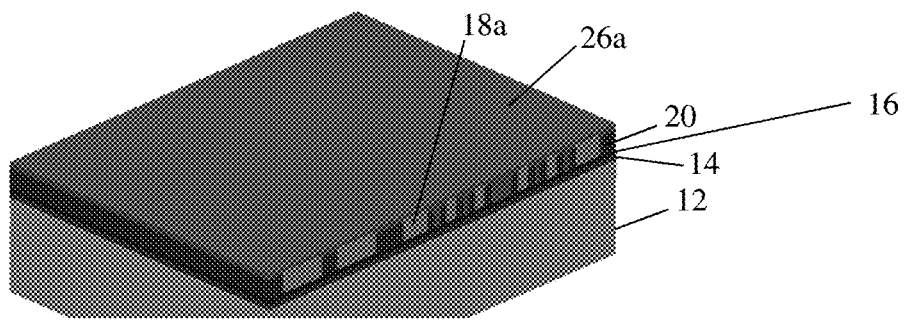
Figure 2J:
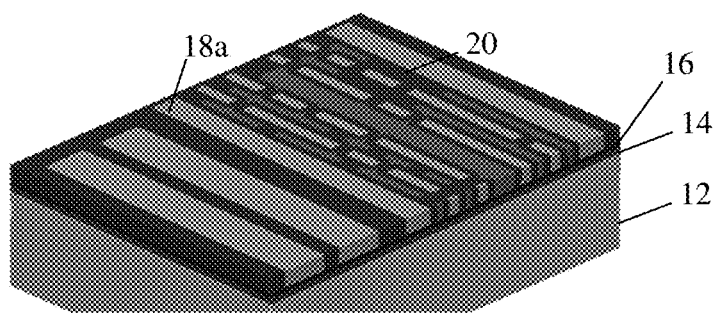
Figure 2K:
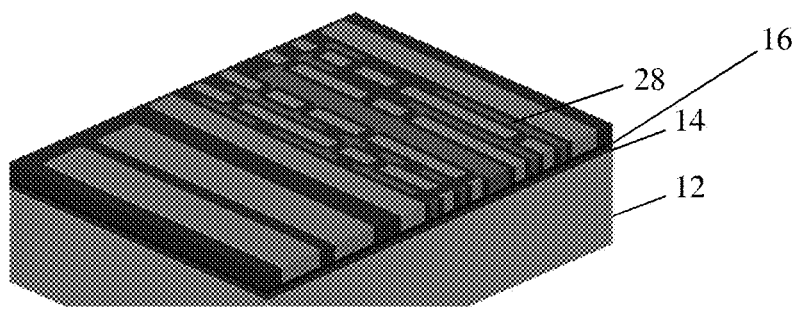

FIGS. 2A-2K show a metal on metal integration scheme with a low-k spacer and a second metal and respective fabrication processes in accordance with aspects of the present disclosure. The structures and processes shown in FIGS. 2A-2H are identical to the features and processes shown in FIGS. 1A-1K, and, as such, no further explanation is required. Starting at FIG. 2I, a film stack 26a is deposited on the mandrel 18a. In a specific embodiment, the film stack 26a is copper. In FIG. 2J, the film stack 26a is planarized by a CMP process. In FIG. 2K, a metal cap 28 is deposited to create a final metal pattern with the cobalt (e.g., film stack 18) on the SOD-LK spacer 20. In a specific embodiment, the metal cap 28 can be Ta growth on the film stack 18. The deposition and patterning of these materials are similar to that discussed and referenced to in FIGS. 1A-1K, such that no further explanation is required for a complete understanding of the structure.

FIGS. 3A-3L show a metal on metal integration scheme with a silicon dioxide spacer and respective fabrication processes in accordance with aspects of the present disclosure. More specifically, in FIG. 3A, the structure 10b includes a wafer 12 composed of semiconductor material, e.g., Si, SiGe, SiGeC, SiC, GaAs, InAs, InP, and any other III/V or II/VI compound semiconductors. A plasma enhanced tetraethyl orthosilicate (PETEOS) material 14 is deposited on the wafer 12, followed by a nitrogen doped carbide (NDC) material 16. A film stack 18 is deposited on the NDC material 16. In a specific embodiment, the film stack 18 is a cobalt film stack. A low temperature oxide hard mask (LTO HM) 30 is deposited on the film stack 18.

Figure 3A:
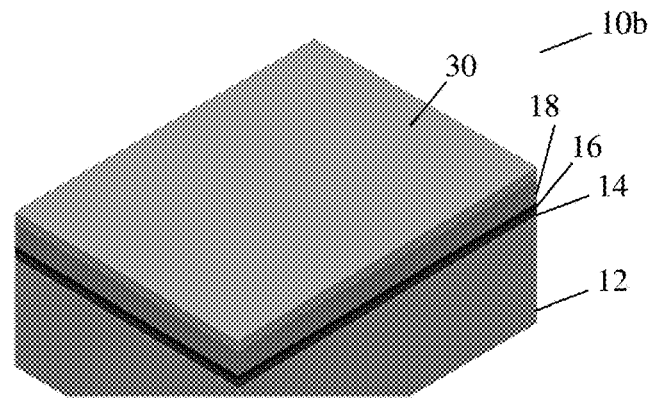
FIGS. 3A-3L show a metal on metal integration scheme with a silicon dioxide spacer and respective fabrication processes in accordance with aspects of the present disclosure.
Figure 3B:
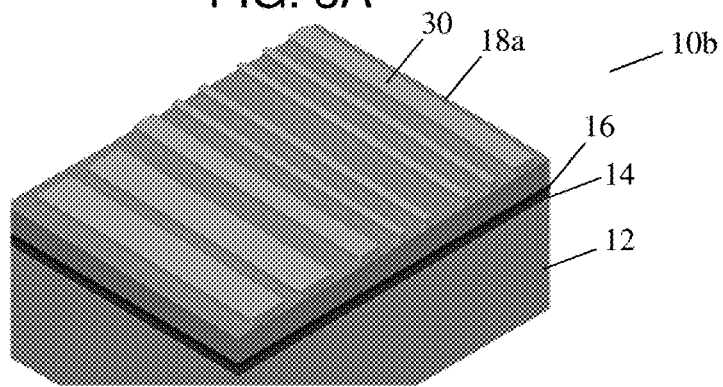
Figure 3C:
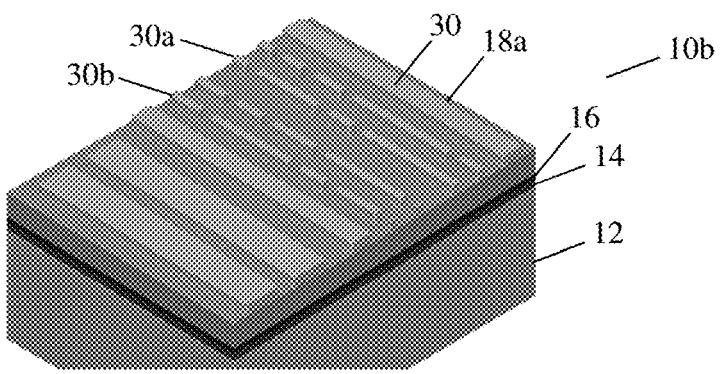

In FIGS. 3B and 3C, the LTO HM 30 is patterned and cut, similar to the processes as already described herein. For example, using the materials and processes described in FIGS. 1A-1B, the LTO HM 30 is patterned and cut as shown by reference numerals 30a, 30b.

Figure 3D:
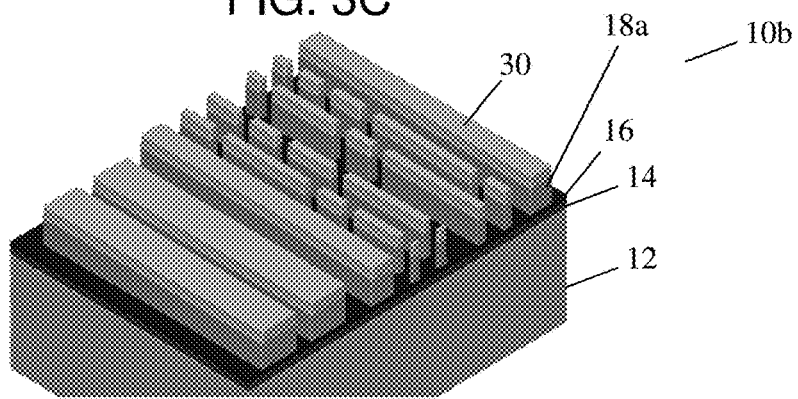

In FIG. 3D, the film stack 18 is patterned and cut to form mandrel 18a in a single etching process using the LTO HM 30 as a hardmask. By using a single etching step, the process steps of the metal mandrel is significantly reduced from the standpoint of both manufacturability and cost.

Figure 3E:
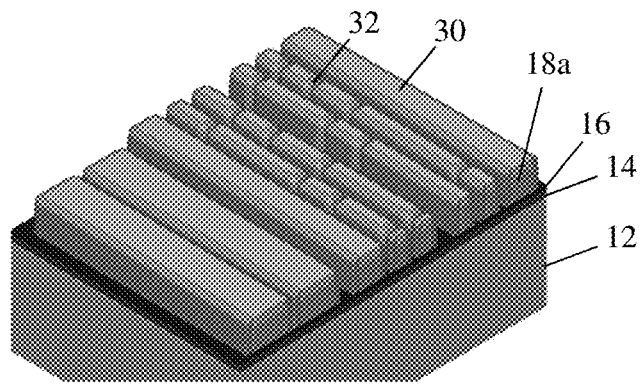
Figure 3F:
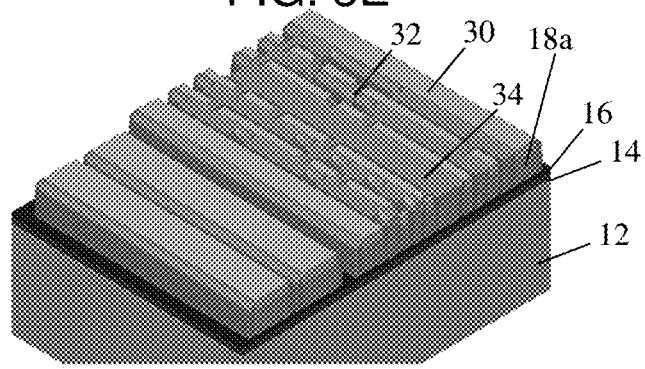

In FIG. 3E, a silicon dioxide ($SiO_2$) spacer 32 is deposited and etched back by an anisotropic etching process. In FIG. 3F, a SOH material 34 is deposited and selectively etched back to within selective portions of the mandrel 18a. The SOH material 34 can be deposited and patterned (e.g., etched back) in a manner already described herein.

Figure 3G:
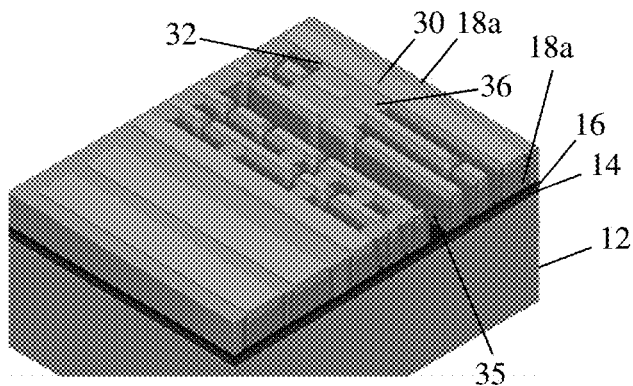
Figure 3H:
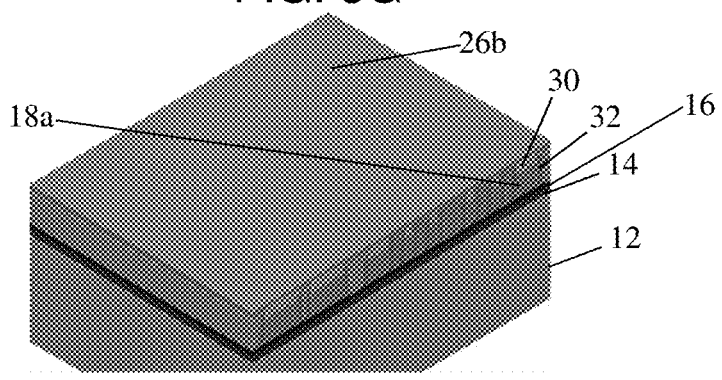
Figure 3I:
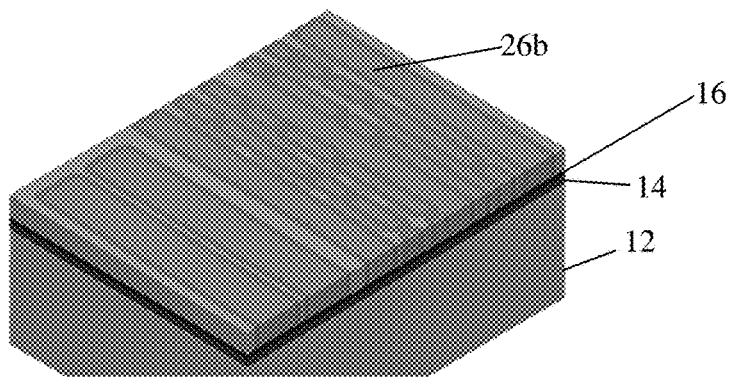

In FIG. 3G, a spin on glass (SOG) coating 36 is formed at selective locations on the spacer 32 and the SOH coating 34. By way of example, the SOG coating 36 is deposited on the structure of FIG. 3F, followed by an etch back process. The etch back process can recess the SOG coating 36 about 10% below the sidewall spacer height. The SOH material is then stripped to form selective openings 35. In FIG. 3H, a film stack 26b is deposited on the LTO HM 30 and within the selective openings 35. In a specific embodiment, the film stack 26b can be a same material as the film stack 18, e.g., cobalt. In an alternative embodiment, the film stack 26b can be copper or other metal material. In FIG. 3I, the film stack 26b is planarized, for example, by CMP.

Figure 3J:
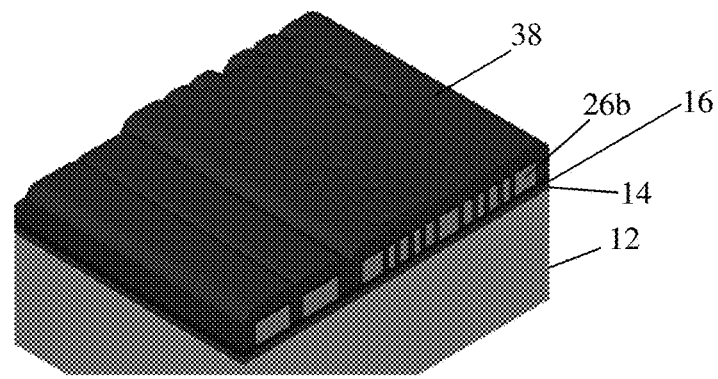

In FIG. 3J, the film stack 26b is etched back and the mandrel 18a is planarized. Following the planarization, the spacers 32 are pulled out, leaving the mandrel 18a. A dielectric liner is then deposited on the film stack 26b, e.g., oxide at a thickness of about 10 nm. A low-k spacer 38 is then deposited on the dielectric liner and within the patterns (spacers) between the mandrel 18a.

Figure 3K:
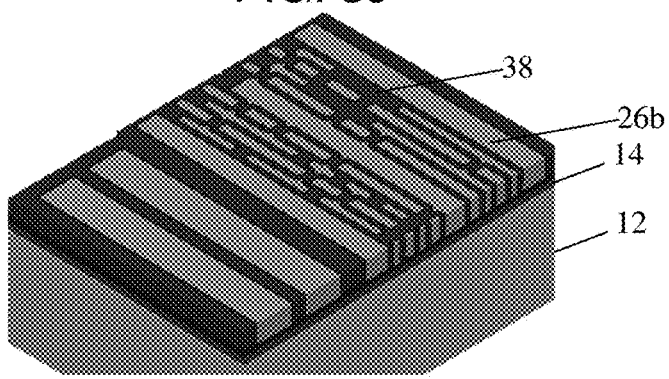
Figure 3L:
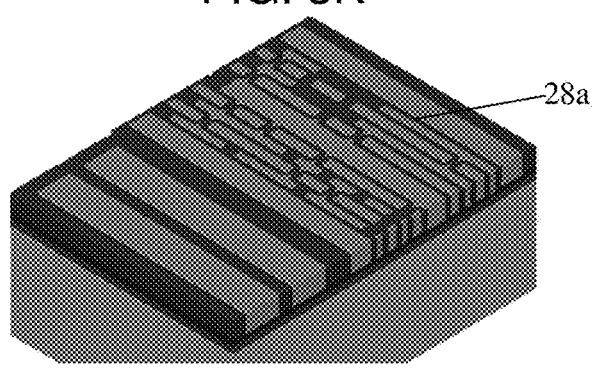

In FIG. 3K, the spacers are polished, e.g., subject to CMP, which stops on the film stack 26b. In FIG. 3L, a metal cap 28a is deposited on the structure to create a final metal pattern with the cobalt (e.g., film stack 26b). In a specific embodiment, the metal cap 28a can be Ta growth on the film stack 26b.

Figure 4A:
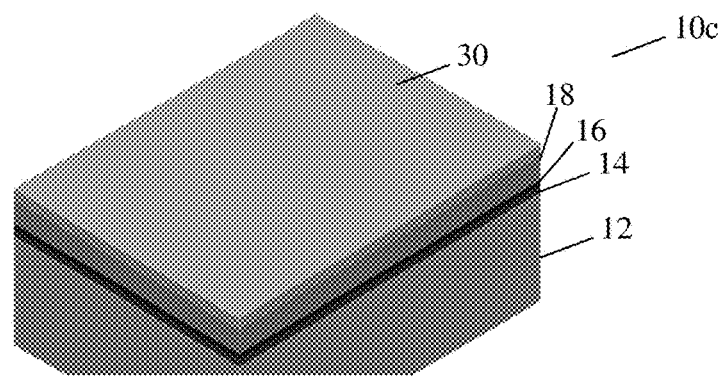
FIGS. 4A-4P show a metal on metal integration scheme with an air gap and respective fabrication processes in accordance with aspects of the present disclosure.
Figure 4B:
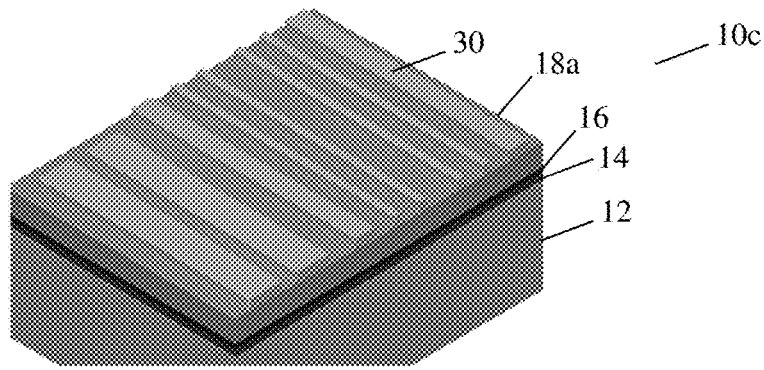
Figure 4C:
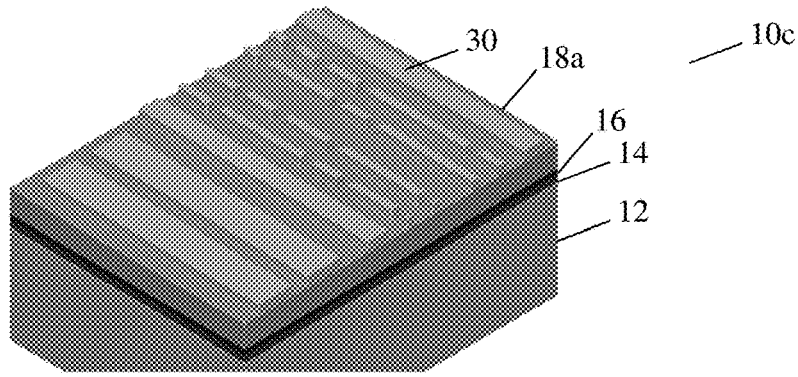
Figure 4D:
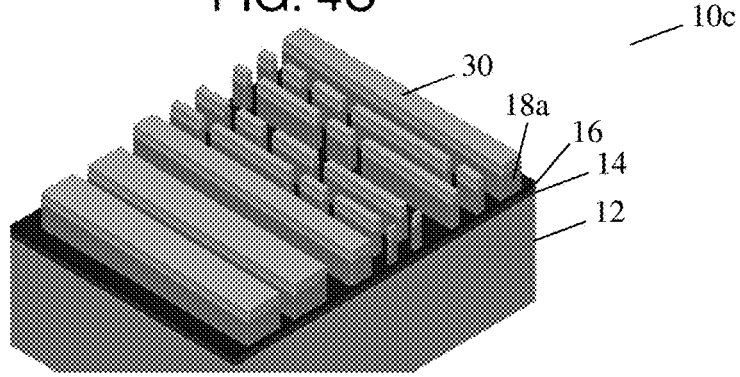
Figure 4E:
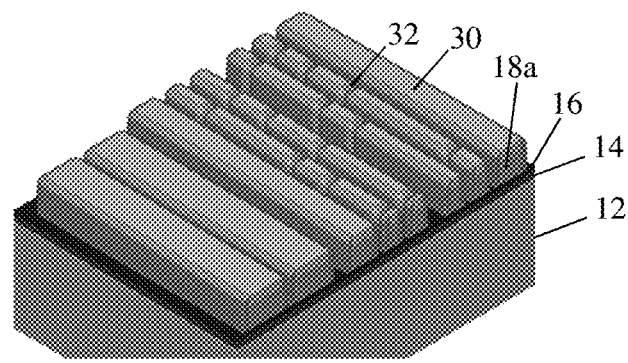
Figure 4F:
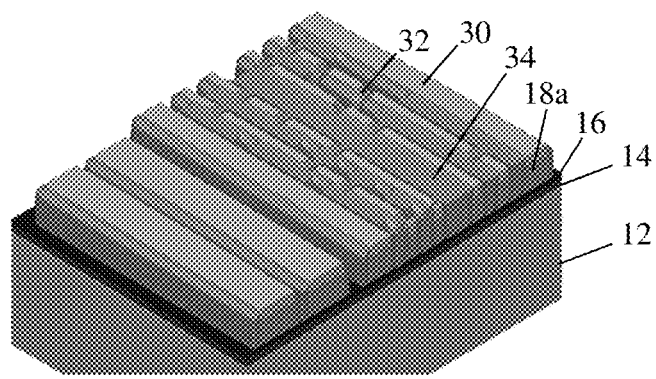
Figure 4G:
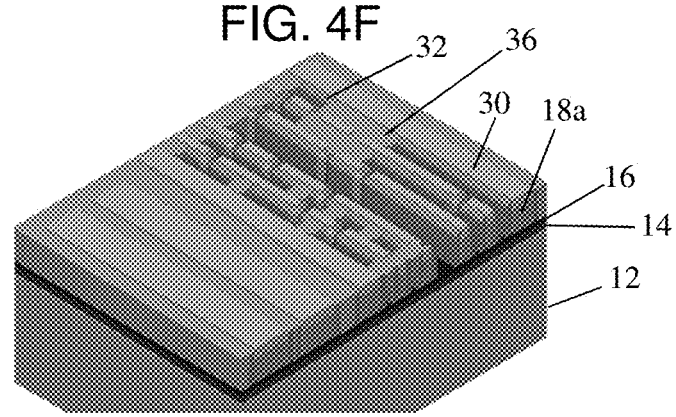
Figure 4H:
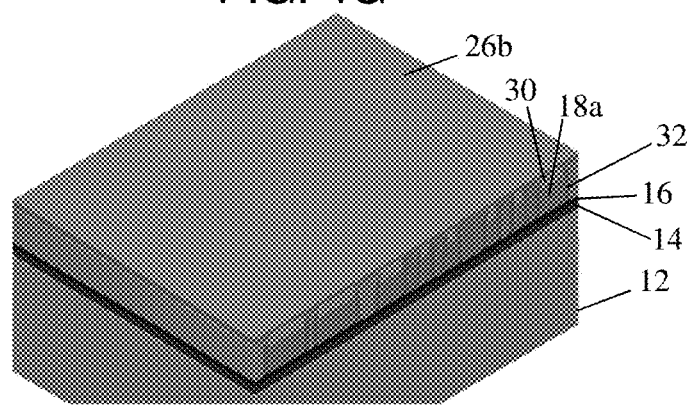
Figure 4I:
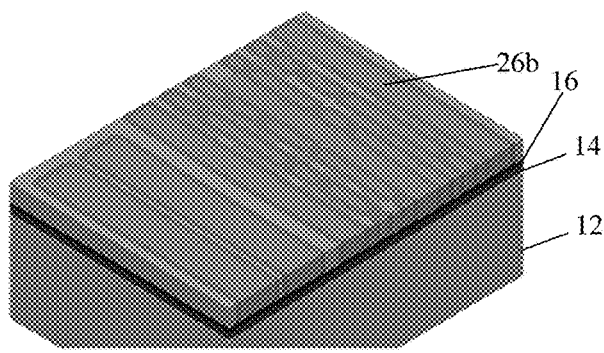
Figure 4J:
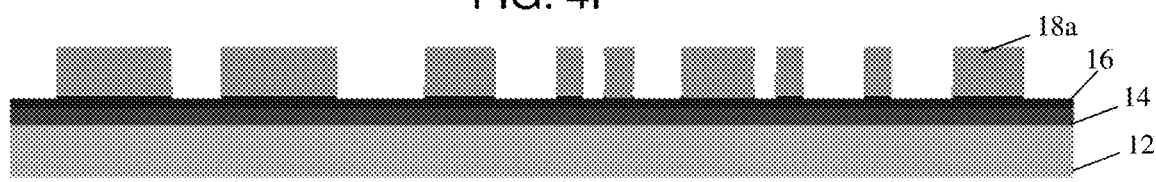
Figure 4K:
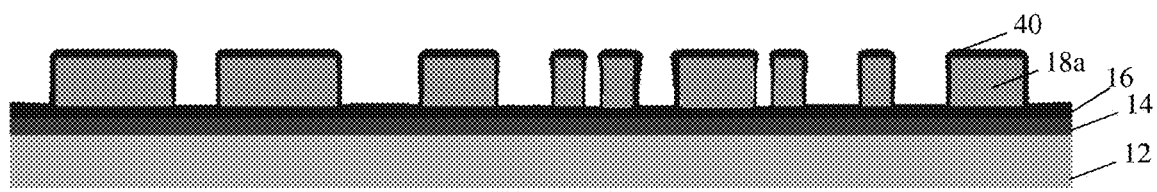
Figure 4L:
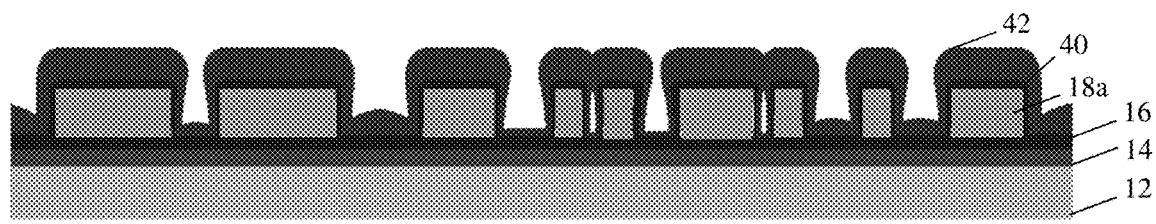
Figure 4M:
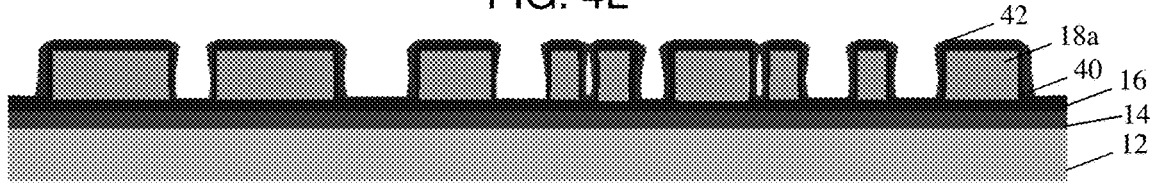
Figure 4N:
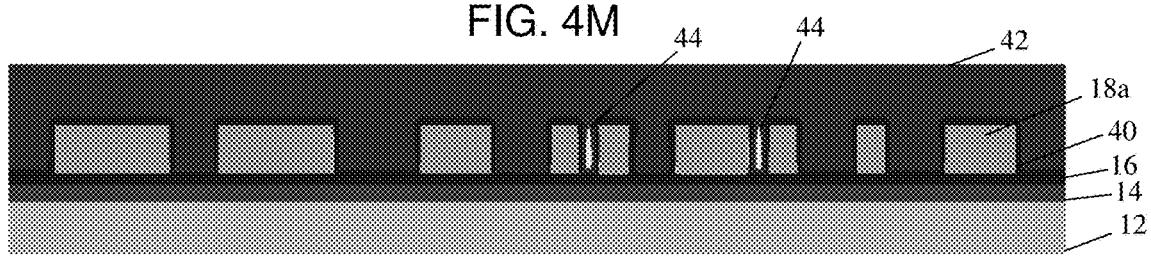
Figure 4O:
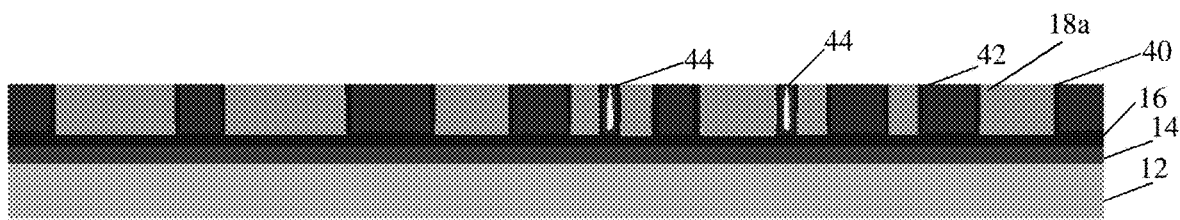
Figure 4P:
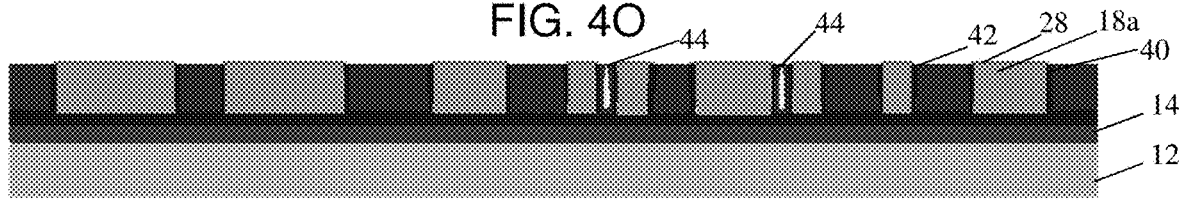

FIGS. 4A-4P show a metal on metal integration scheme with an air gap and respective fabrication processes in accordance with aspects of the present disclosure. The structure and processes shown in FIGS. 4A-4I are identical to the features and processes shown in FIGS. 3A-3I, and, as such, no further explanation is required. In FIG. 4J, the film stack 26b is etched back and the mandrel (e.g., metal) 18a is planarized by CMP. Following the planarization, the spacers 32 (i.e., sacrificial layers) are pulled out, leaving the mandrel 18a. In FIG. 4K, a nitrogen doped carbide (NDC) liner 40 is deposited on the mandrel 18a at a thickness of, e.g., about 10 nm. In FIG. 4L, an anisotropic low-k material 42 is deposited on the NDC liner 40 and within the patterns (spacers) between the mandrel 18a. In FIG. 4M, a non-mandrel cut is performed of the low-k material 42. In FIG. 4N, the low-k material 42 is deposited, which forms pinched-off air-gaps 44 between the metal mandrel 18a (i.e., between the metals). The structure 10c including the air-gaps 44 is shown in FIG. 4N. In FIG. 4O, the low-k material 42 is planarized, for example, by CMP. In FIG. 4P, a metal cap 28 is deposited on the structure to create a final metal pattern with the cobalt (e.g., film stack 18a) in the low-k material 42 and air-gaps 44. In a specific embodiment, the metal cap 28 can be Ta growth on the film stack 18a.

Figure 5A:
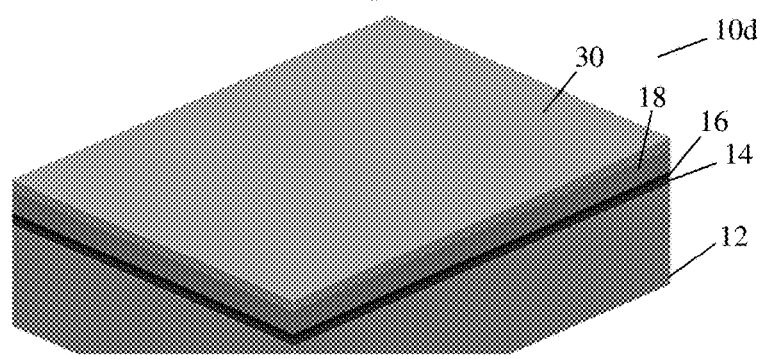
FIGS. 5A-5O show a metal on metal integration scheme with no kink and respective fabrication processes in accordance with aspects of the present disclosure.
Figure 5B:
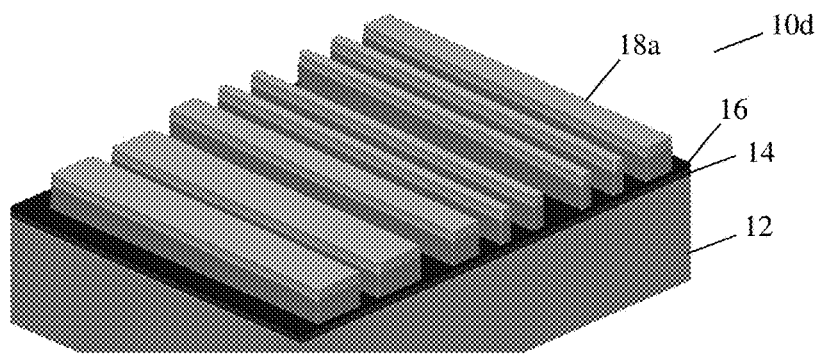
Figure 5C:
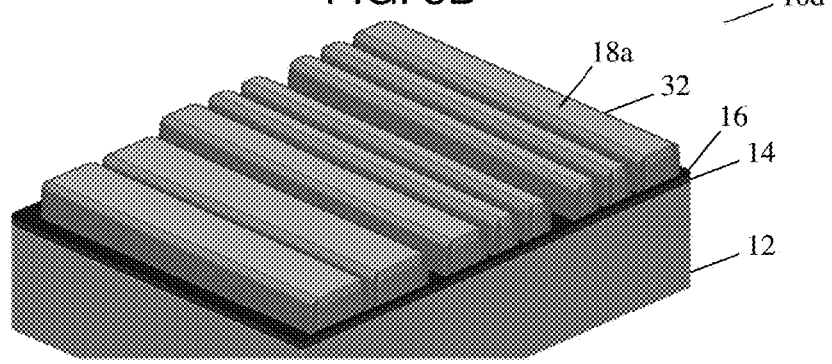
Figure 5D:
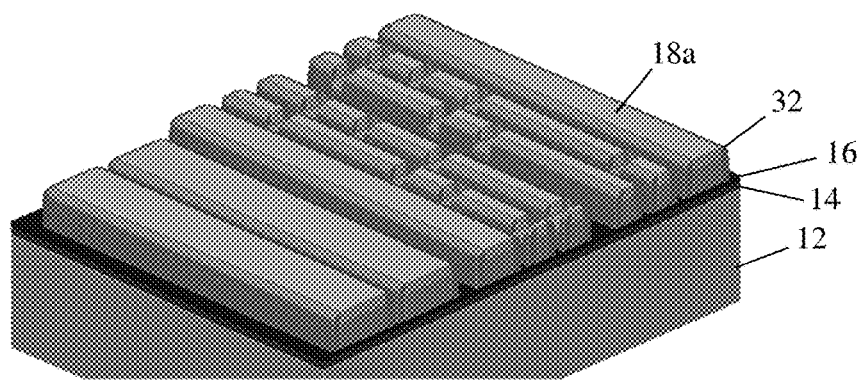
Figure 5E:
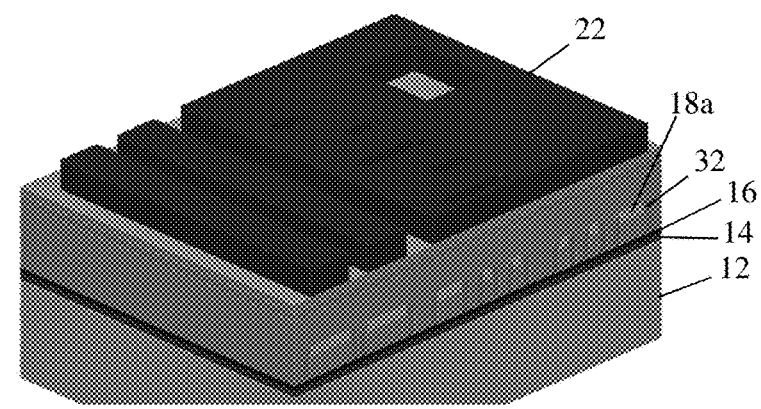
Figure 5F:
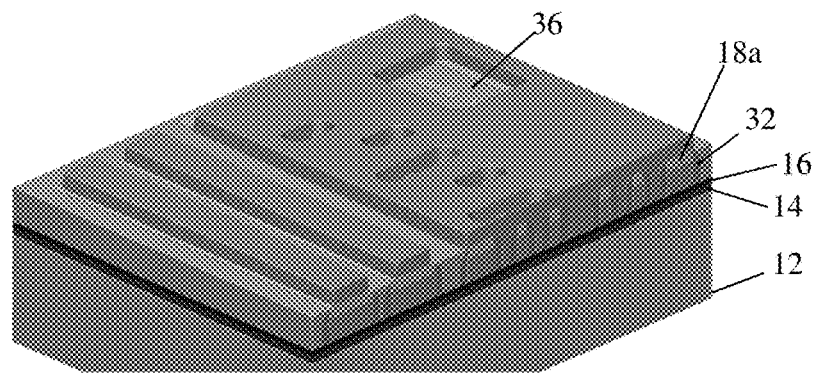
Figure 5G:
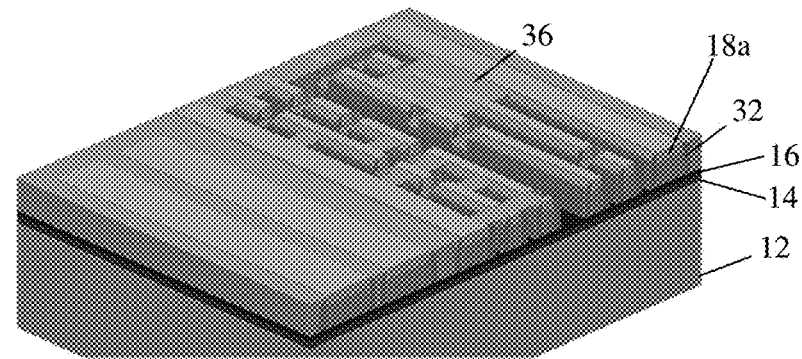
Figure 5H:
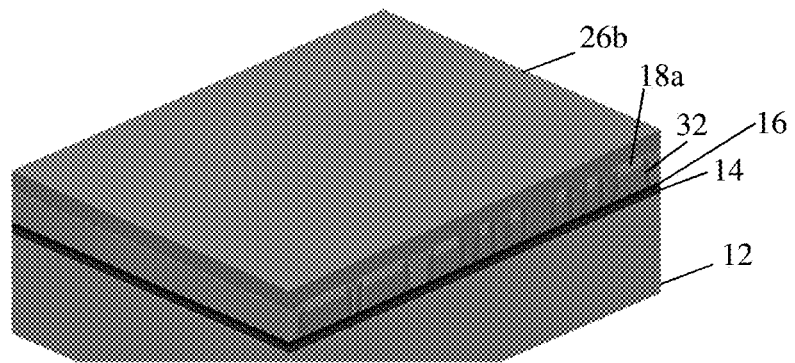
Figure 5I:
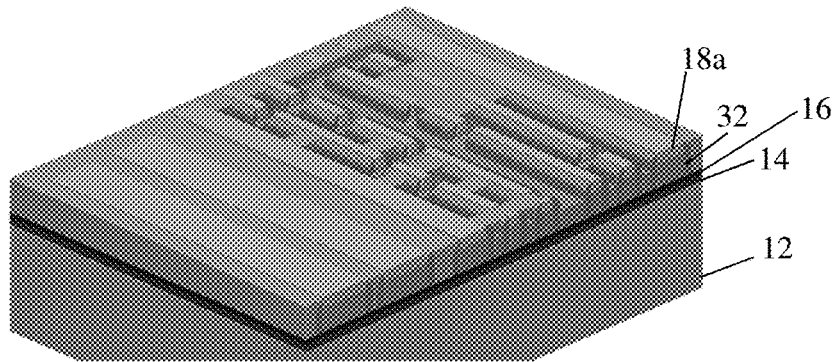
Figure 5J:
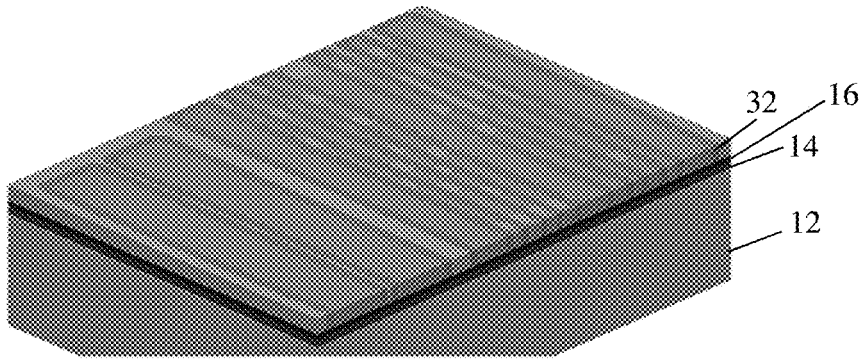
Figure 5K:
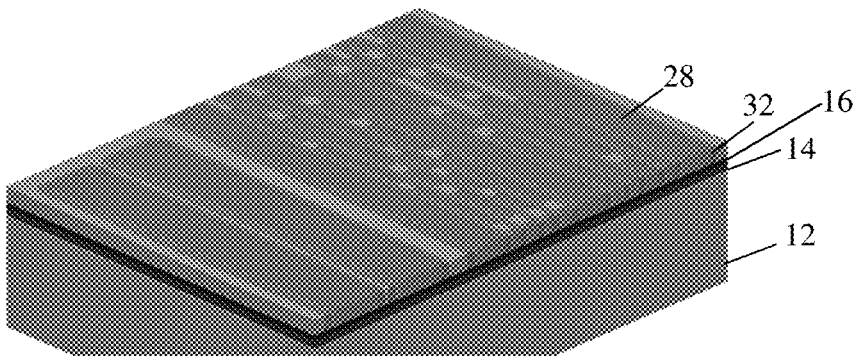
Figure 5L:
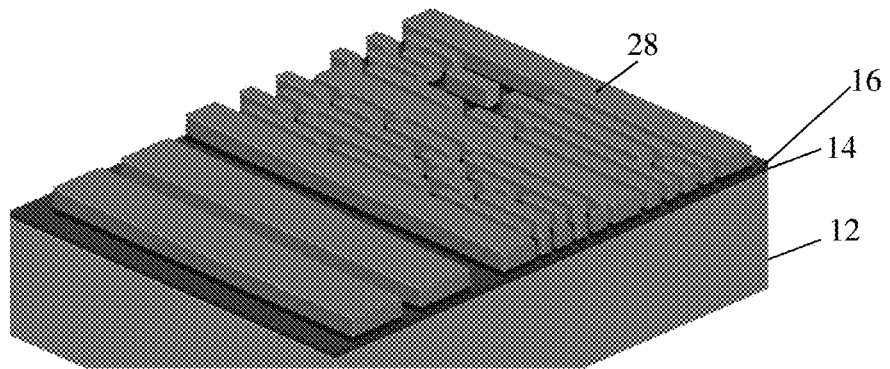
Figure 5M:
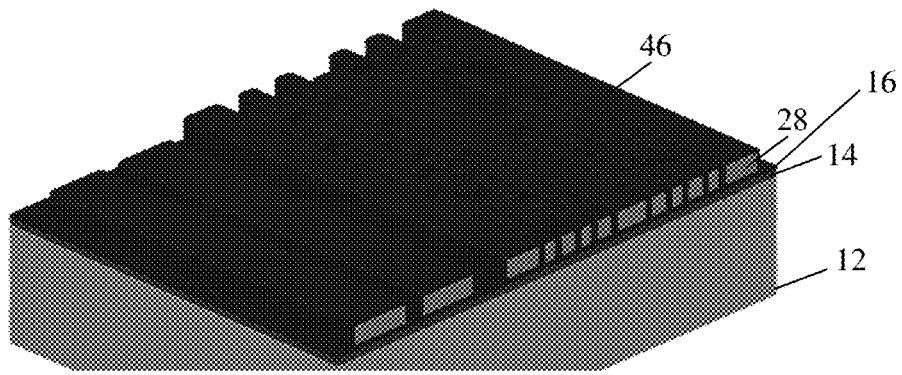
Figure 5N:
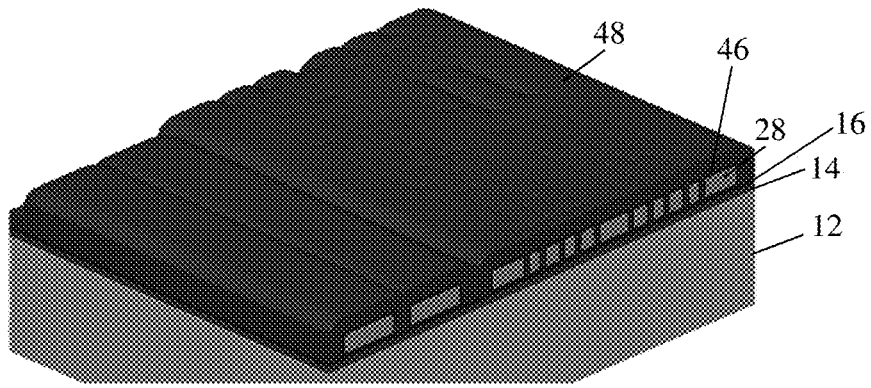
Figure 5O:
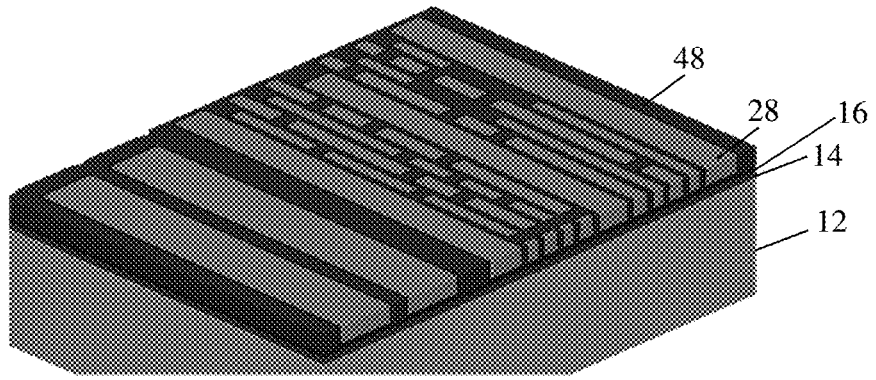

FIGS. 5A-5O show a metal on metal integration scheme with no kink and respective fabrication processes in accordance with aspects of the present disclosure. The structures and processes shown in FIGS. 5A-5D are similar to the features and processes shown in FIGS. 3A-3E, and, as such, no further explanation is required.

In FIG. 5E, a non-mandrel cut litho patterned material 22 is deposited and patterned on the mandrel 18a with a critical dimension (CD), e.g., 50 nm. In FIG. 5F, the SOH coating 36 is then etched. In FIG. 5G, the SOH coating 36 is also stripped. In a specific embodiment, the SOH is selectively stripped without a mask.

In FIG. 5H, a film stack 26b is deposited on the mandrel 18a. In a specific embodiment, the film stack 26b is cobalt. In an alternative embodiment, the film stack 26b can be a different material than the film stack 18. In FIGS. 5I and 5J, the film stack 26b can be etched back and planarized, for example, by a chemical mechanical planarization (CMP) process. In FIG. 5K, a metal cap 28 is deposited to create a metal pattern. In FIG. 5L, the silicon dioxide (SiO$_2$) spacer 32 can be pulled out. In FIG. 5M, another film stack 46 is deposited. In a specific embodiment, the film stack 46 can be cobalt. In an alternative embodiment, the film stack 46 can be a different material than the film stack 18 (e.g., copper). In FIG. 5N, a low-k material 48 is deposited on the film stack 46. In FIG. 5O, the low-k material 48 is planarized, for example, by a chemical mechanical planarization (CMP) process.

FIGS. 6A-6M show a metal on metal integration scheme with no kink and respective fabrication processes in accordance with aspects of the present disclosure. The structures and processes shown in FIGS. 6A-6D are similar to the features and processes shown in FIGS. 2A-2E, and, as such, no further explanation is required.

Figure 6A:
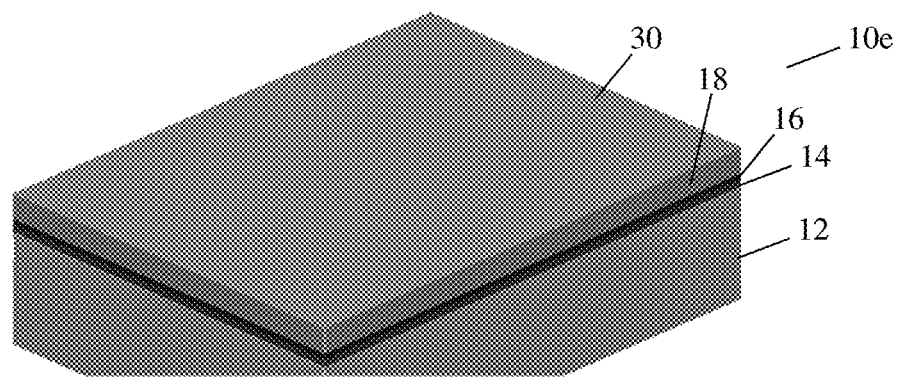
FIGS. 6A-6M show a metal on metal integration scheme with no kink and respective fabrication processes in accordance with aspects of the present disclosure.
Figure 6B:
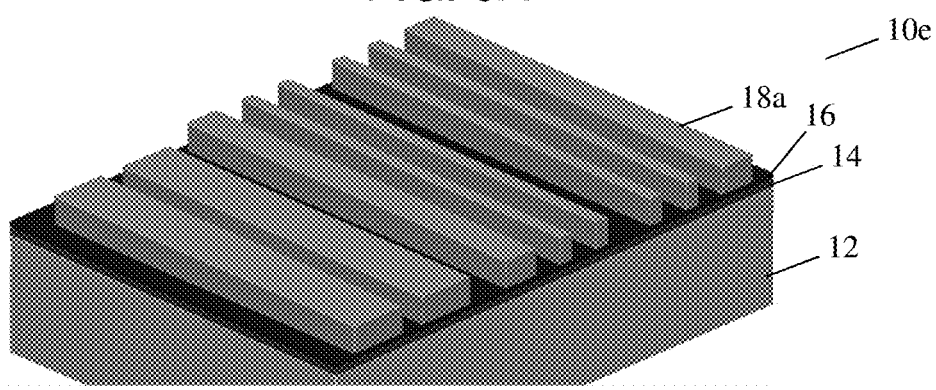
Figure 6C:
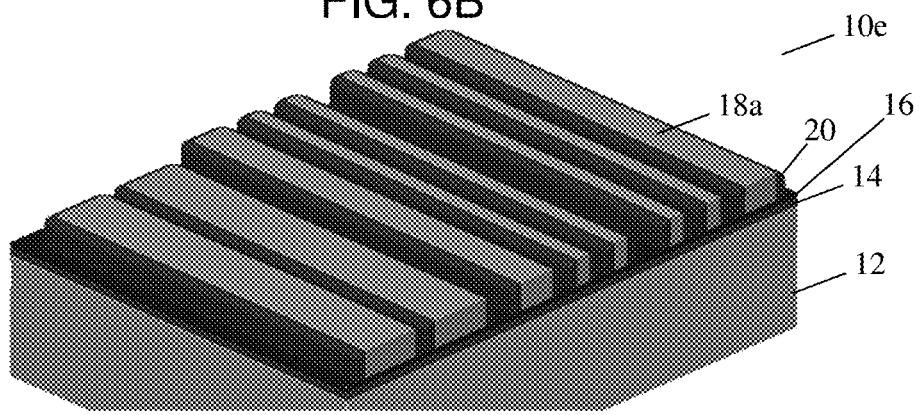
Figure 6D:
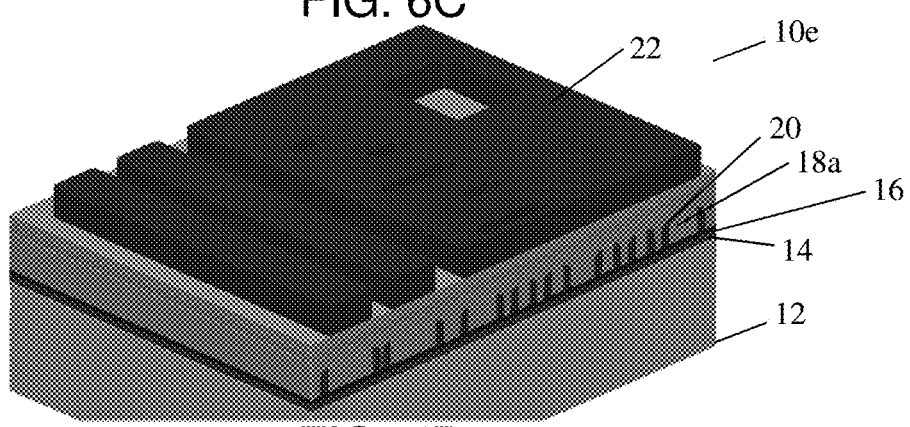
Figure 6E:
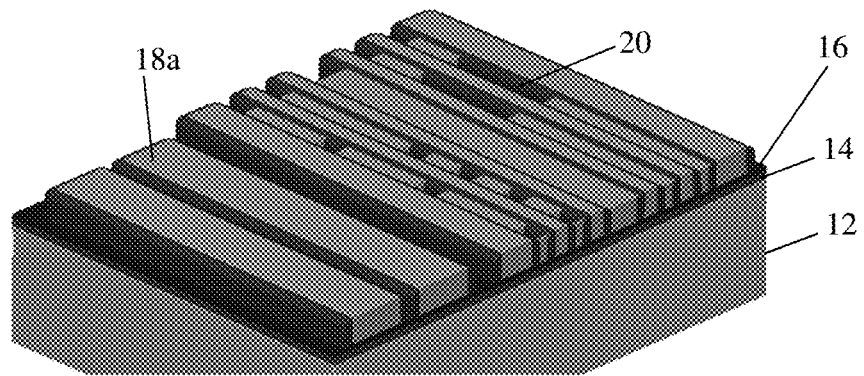
Figure 6F:
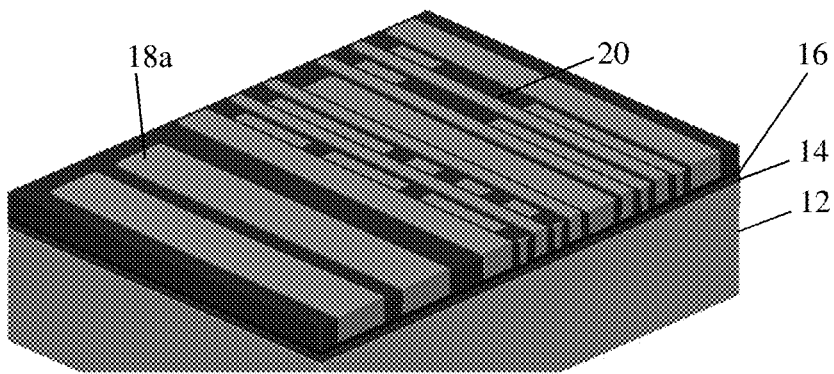
Figure 6G:
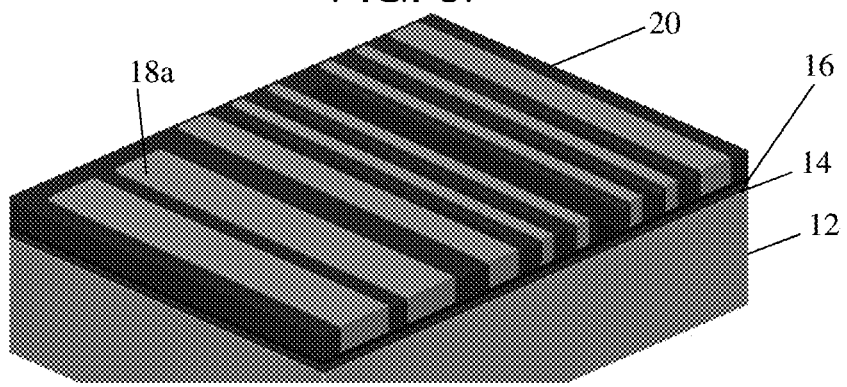

In FIG. 6E, the SOH coating is etched back. In FIG. 6F, the spin on dielectric low-k (SOD-LK) spacer 20 is etched back and planarized. In FIG. 6G, the SOH is stripped. In a specific embodiment, the SOH is selectively stripped without a mask.

Figure 6H:
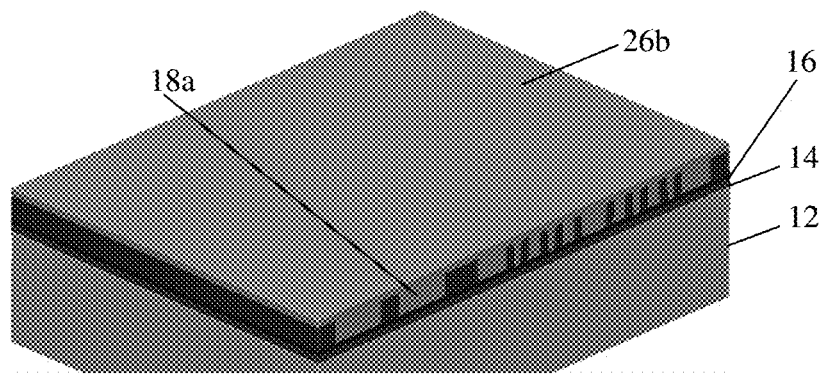
Figure 6I:
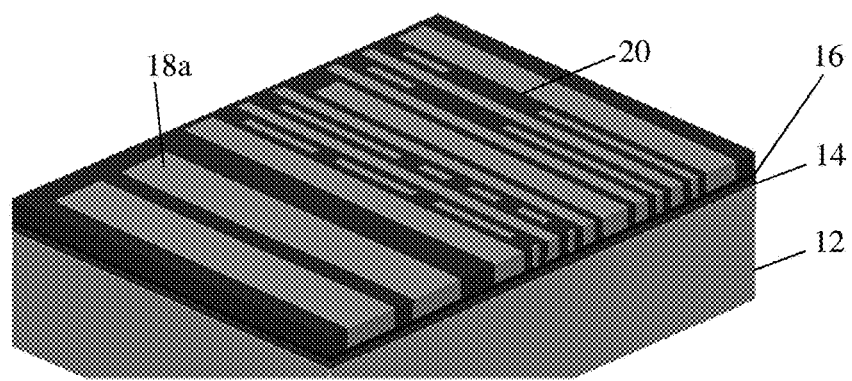
Figure 6J:
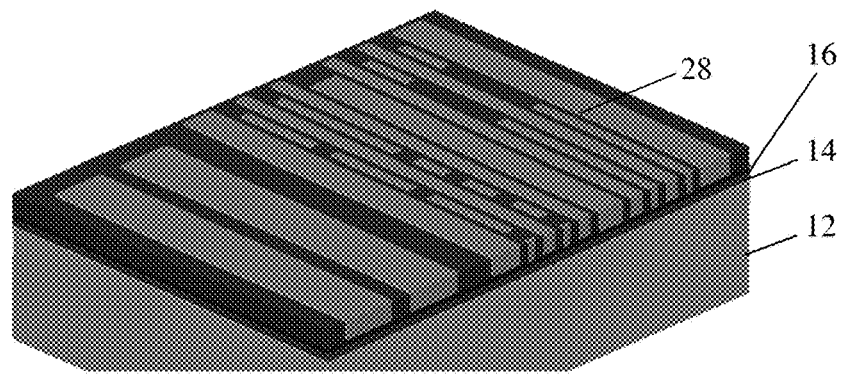

In FIG. 6H, a film stack 26b is deposited on the mandrel patterned structure 18a. In a specific embodiment, the film stack 26b can be cobalt. In an alternative embodiment, the film stack 26b can be a different material than the film stack 18 (e.g., copper). In FIG. 6I, the film stack 26b is planarized, for example, by a chemical mechanical planarization (CMP) process. In FIG. 6J, a metal cap 28 is deposited to create a metal pattern. In a specific embodiment, the metal cap 28 can be Ta growth on the film stack 18.

Figure 6K:
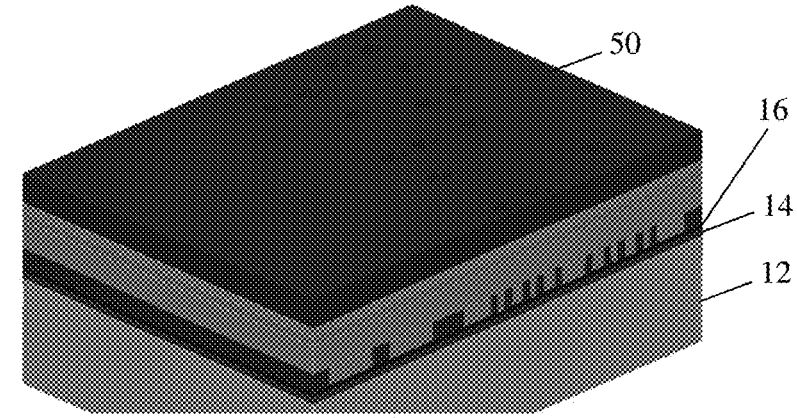
Figure 6L:
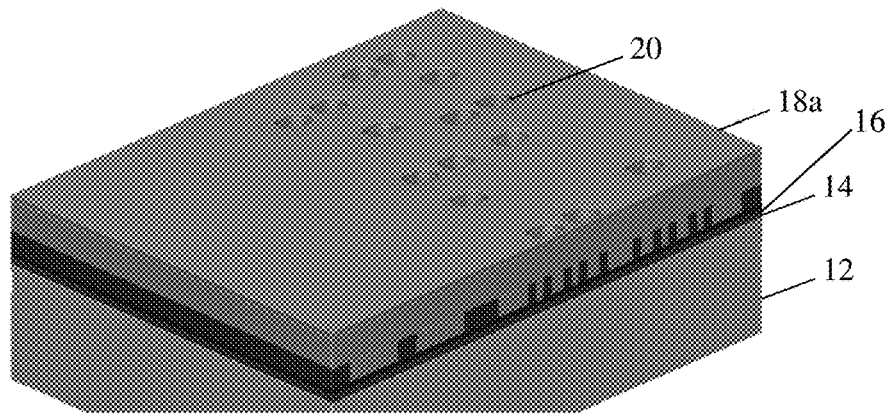
Figure 6M:
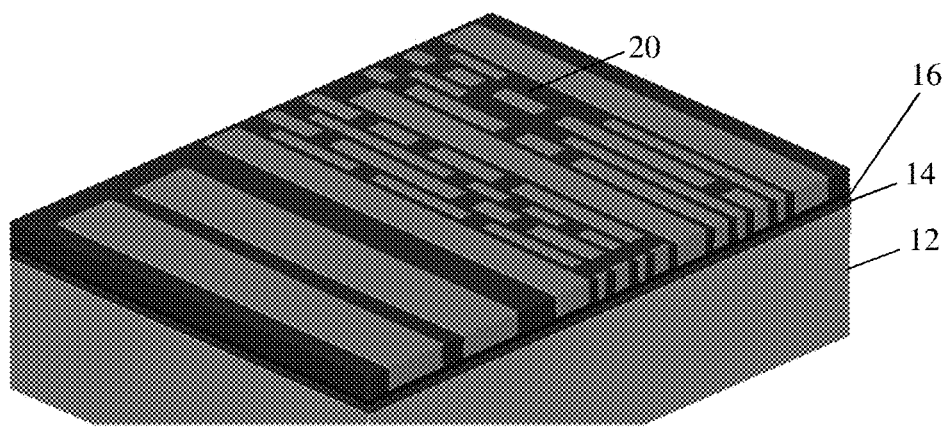

In FIG. 6K, a mandrel cut litho material 50 is deposited and patterned on the metal cap 28. In FIG. 6L, a spin on dielectric low-k (SOD-LK) spacer 20 is deposited on the mandrel cut litho material 50 and then etched back using an anisotropic etch to remove the SOD-LK spacer 20 from horizontal surfaces. In FIG. 6M, the SOD-LK spacer 20 is planarized, for example, by a chemical planarization (CMP) process.

The structure and method for using a metal on metal integration scheme of the present disclosure can be manufactured in a number of ways using a number of different tools. In general, though, the methodologies and tools are used to form structures with dimensions in the micrometer and nanometer scale. The methodologies, i.e., technologies, employed to manufacture the structure and method for using a metal on metal integration scheme of the present disclosure has been adopted from integrated circuit (IC) technology. For example, the structures are built on wafers and are realized in films of material patterned by photolithographic processes on the top of a wafer. In particular, the fabrication of the structure and method for using a metal on metal integration scheme uses three basic building blocks: (i) deposition of thin films of material on a substrate, (ii) applying a patterned mask on top of the films by photolithographic imaging, and (iii) etching the films selectively to the mask.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method, comprising:
    patterning a first metal layer as a mandrel;
    forming a dielectric spacer on the first metal layer;
    forming a second metal layer on the dielectric spacer; and
    forming a metal cap on the second metal layer.

2. The method of claim 1, further comprising forming at least one airgap between patterned sections of the first metal layer.

3. The method of claim 2, wherein the at least one airgap is surrounded by the dielectric spacer.

4. The method of claim 1, further comprising forming nitrogen doped carbide on sections of the mandrel.

5. The method of claim 1, further comprising forming a plurality of pinched off airgaps between sections of the mandrel by deposition of a dielectric material between sections of the mandrel.

6. The method of claim 1, wherein the dielectric spacer comprises a low-k dielectric material.

7. The method of claim 1, wherein the first metal layer is a same material as the second metal layer.

8. The method of claim 7, wherein the first metal layer and the second metal layer comprises one of cobalt, ruthenium, nickel, aluminum, tungsten, and tantalum.

9. The method of claim 1, wherein the first metal layer is a different material than the second metal layer.

10. The method of claim 1, further comprising forming a plurality of cuts in the mandrel.

11. The method of claim 1, wherein the metal cap comprises tantalum.

12. A method, comprising:
   forming a metal mandrel with cuts along its longitudinal extent;
   forming a metal layer on the metal mandrel;
   forming a plurality of low-k dielectric spacers on sidewalls of the metal mandrel;
   forming a metal cap on the metal layer; and
   forming at least one airgap between sections of patterned metal in the metal mandrel,
   wherein the at least one airgap is entirely surrounded by the low-k dielectric spacers.

13. The method of claim 12, wherein the metal mandrel and the metal layer comprises cobalt.

14. The method of claim 12, wherein the metal mandrel is a different material than the metal layer.

15. A method comprising:
   forming a mandrel with cuts along its longitudinal extent;
   forming a metal layer on the mandrel;
   forming a plurality of low-k dielectric spacers on sidewalls of the mandrel; and
   forming a metal cap on the metal layer,
   wherein the mandrel is a different material than the metal layer.

16. The method of claim 15, further comprising depositing a metal cap on the plurality of low-k dielectric spacers and which entirely surrounds the at least one airgap.

17. The method of claim 16, further comprising forming nitrogen doped carbide on sections of the mandrel.

18. The method of claim 15, further comprising forming at least one airgap which includes a plurality of pinched off airgaps formed by deposition of a low-k material between sections of the mandrel.

19. The method of claim 15, wherein the mandrel is formed by patterning a film stack.

20. The method of claim 19, wherein the mandrel comprises cobalt and the metal layer comprises copper.

* * * * *